(12) United States Patent
Boezen et al.

(10) Patent No.: US 8,787,502 B2
(45) Date of Patent: Jul. 22, 2014

(54) CAPACITIVE ISOLATED VOLTAGE DOMAINS

(75) Inventors: Hendrik Boezen, Nijmegen (NL); Martijn Bredius, San Jose, CA (US)

(73) Assignee: NXP B.V., Eindhoven (NL)

( * ) Notice: Subject to any disclaimer, the term of this patent is extended or adjusted under 35 U.S.C. 154(b) by 85 days.

(21) Appl. No.: 13/454,739

(22) Filed: Apr. 24, 2012

(65) Prior Publication Data

US 2013/0279550 A1 Oct. 24, 2013

(51) Int. Cl.
*H04L 25/06* (2006.01)
(52) U.S. Cl.
USPC ............................................. 375/319; 375/317
(58) Field of Classification Search
USPC ........................................................ 375/219
See application file for complete search history.

(56) References Cited

U.S. PATENT DOCUMENTS

| | | | |
|---|---|---|---|
| 3,273,033 A | 9/1966 | Rossmeisl | |
| 4,292,595 A | 9/1981 | Smith | |
| 4,723,307 A * | 2/1988 | Clark et al. | 455/103 |
| 4,748,419 A * | 5/1988 | Somerville | 330/10 |
| 5,187,637 A | 2/1993 | Embree | |
| 5,259,002 A | 11/1993 | Carlstedt | |
| 5,321,597 A | 6/1994 | Alacoque | |
| 6,347,395 B1 | 2/2002 | Payne et al. | |
| 6,636,166 B2 | 10/2003 | Sessions et al. | |
| 6,839,862 B2 | 1/2005 | Evoy et al. | |
| 6,859,883 B2 | 2/2005 | Svestka et al. | |
| 6,882,046 B2 | 4/2005 | Davenport et al. | |
| 6,920,576 B2 | 7/2005 | Ehmann | |
| 7,031,458 B2 | 4/2006 | Holcombe et al. | |
| 7,061,406 B1 | 6/2006 | Dally et al. | |
| 7,302,247 B2 | 11/2007 | Dupuis | |
| 7,376,212 B2 | 5/2008 | Dupuis | |
| 7,421,028 B2 | 9/2008 | Dupuis | |
| 7,447,492 B2 | 11/2008 | Dupuis | |
| 7,460,604 B2 | 12/2008 | Dupuis | |
| 7,577,223 B2 | 8/2009 | Alfano et al. | |
| 7,650,130 B2 | 1/2010 | Dupuis | |
| 7,724,815 B1 * | 5/2010 | Raha et al. | 375/230 |
| 7,737,871 B2 | 6/2010 | Leung et al. | |
| 7,738,568 B2 | 6/2010 | Alfano et al. | |
| 7,755,400 B2 | 7/2010 | Jordanger et al. | |
| 7,821,428 B2 | 10/2010 | Leung et al. | |

(Continued)

OTHER PUBLICATIONS

Greg Smith, "Hybrid Isolation Amps Zap Price and Voltage Barriers" Electronic Design, Dec. 11, 1986, pp. 91-?.

(Continued)

*Primary Examiner* — Santiago Garcia

(57) ABSTRACT

In one embodiment, a method of communicating data values over a three conductor interface is provided. Different data values are transmitted by generating and transmitting three respective signals to a receiver using three conductors. The first signal is maintained as a set voltage level. The second signal is alternated between a high voltage and a low voltage according to a carrier frequency. The third signal is alternated between the high and low voltages and is out of phased with the second signal. To transmit a first data value, the first signal is generated on a first conductor, the second signal is generated on a second conductor, and the third signal is generated on a third conductor. To transmit a second data value, the second signal is generated on the first conductor, the first signal is generated on the second conductor, and the third signal is generated on the third conductor.

14 Claims, 3 Drawing Sheets

(56) References Cited

U.S. PATENT DOCUMENTS

| | | | |
|---|---|---|---|
| 7,856,219 | B2 | 12/2010 | Dupuis |
| 7,902,627 | B2 | 3/2011 | Dong et al. |
| 8,049,573 | B2 | 11/2011 | Alfano et al. |
| 8,064,872 | B2 | 11/2011 | Dupuis |
| 2002/0184544 | A1 | 12/2002 | Svestka et al. |
| 2003/0021390 | A1* | 1/2003 | Delbecq et al. ............ 379/22.01 |
| 2004/0174147 | A1* | 9/2004 | Vinciarelli ................... 323/266 |
| 2009/0017773 | A1 | 1/2009 | Dupuis et al. |
| 2009/0213914 | A1 | 8/2009 | Dong et al. |
| 2010/0052826 | A1 | 3/2010 | Callahan et al. |
| 2010/0118918 | A1 | 5/2010 | Dupuis |
| 2013/0024059 | A1* | 1/2013 | Miller et al. .................... 701/22 |
| 2013/0128396 | A1* | 5/2013 | Danesh et al. ................. 361/45 |

OTHER PUBLICATIONS

Wally Meinel, et al., "Hermetic Analog Isolation Amplifier", Proceedings of the 1987 International Symposium on Microelectronics, Minneapolis, Sep. 1987.

Burr Brown, Noise Sources in Applications Using Capacitive Coupled Isolated Amplifiers, Application Bulletin, Burr Brown Corporation, 1993.

Burr Brown, Hybrid Isolation Amps Zap Price and Voltage Barriers, Application Bulletin, Burr Brown Corporation, 1994.

Burr Brown, An error analysis of the ISO102 in a small signal measuring application, Application Bulletin, Burr Brown Corporation, 1994.

Burr Brown, ISO 102, ISO 106 Signal Isolation Buffer Amplifiers, Datasheet, Burr Brown Corporation, 1995.

J. Basilio Simoes, et al., "The Optical Coupling of Analog Signals" IEEE Transaction on Nuclear Science, vol. 43, No. 3, Jun. 1996, pp. 1672-1674.

Stephen L. Diamond, "IEEE 1394: Status and growth path", IEEE Micro, Jun. 1996, pp. 75-78.

Thaddeus J. Gabara, et al., "Capacitive coupling and quantized feedback applied to conventional CMOS technology" IEEE Journal of Solid-State Circuits, vol. 32, No. 3, Mar. 1997.

Adrian Paskins, "The IEEE 1394 Bus", The Institution of Electrical Engineers Conference, May 12, 1997.

Richard Crisp, "Direct Rambus Technology: The New Main Memory Standard" IEEE Micro, Nov./Dec. 1997, pp. 18-28.

Thomas Nilsson, "A distributed combined heat and power plant control unit", Master Thesis, Linköping Institute of Technology, Dec. 16, 1997.

Scott Wayne, "Finding the Needle in a Haystack: Measuring Small differential voltages in the presence of large-common mode voltages", Analog Dialogue, 34-1, 2000, pp. 1-4.

Infineon Technologies, IVAX Integrated Voice & ADSL Transceiver, PEB35512, PEB55508, PEB3558, PEB4565, PEB4566, Datasheet, Infineon Technologies AG, 2001.

William B. Kuhn, et al., "An RF-based IEEE 1394 Ground Isolator designed in silicon-on-insulator process" Circuits and Systems, 2001. MWSCAS 2001. Proceedings of the 44th IEEE 2001 Midwest Symposium on ,vol. 2, Aug. 14-17, 2001.

Scott Irwin, XILINX, "Usage Models for multi-gigabit serial transceivers", WP157, V.1.0, Mar. 15, 2002.

phyCORE-MCF548x Hardware Manual, PHYTEC Technology Holding Company, Jan. 2005.

LANTRONIX, Xpress-DR+Wireless, Datasheet, LANTRONIX, 2006.

Eugenio Culurciello, et al., "Capacitive inter-chip data and power transfer for 3-D VLSI" IEEE Trans. Circuits Syst. II, vol. 53, No. 12, pp. 1348-1352, 2006.

Geoffrey Marcus, et al., "A Monolithic Isolation Amplifier in silicon-on-isolator CMOS: Testing and Applications", Analog Integr. Circ. Sig. Process, Jun. 27, 2006.

* cited by examiner

CAPACITIVE ISOLATED VOLTAGE DOMAINS

Aspects of the present disclosure relate to apparatuses, devices and methods involving communication interfaces useful for galvanic isolation in circuits.

Galvanic isolation has been used for a variety of different applications. For instance, galvanic isolation can be provided between multiple integrated circuit chips, which can be located within the same package or in different packages. Signals can be passed between the integrated circuits using galvanic isolation techniques. One type of galvanic isolation technique involves the use of differential signaling and capacitive coupling. These and other galvanic isolation techniques have various undesirable tradeoffs in properties such as, but not necessarily limited to, signal propagation delays, power consumption, pulse width distortion and carrier frequency requirements.

Differential signaling solutions use two separate wires upon which corresponding signals are then transmitted differentially. The differentially transmitted signals can be modulated in a number of different manners in order to convey data. A few non-limiting examples include frequency modulation, amplitude modulation and on-off keying. Differential signaling solutions use a receiver that uses a direct comparison between the signal levels for each of the two transmitted signals. This direct comparison between two differentially transmitted signals is useful, but also carries some disadvantages.

Aspects of the present disclosure relate generally to methods, circuits, and devices for communication of data between galvanically isolated circuits.

In some embodiments, a method of communicating data values over a three conductor interface is provided. Different data values are transmitted by generating and transmitting three respective signals to a receiver using three respective conductors. The first signal is maintained as a set voltage level. The second signal is alternated between a high voltage and a low voltage according to a carrier frequency. The third signal is alternated between the high and low voltages and is out of phased with the second signal. To transmit a first data value, the first signal is generated on a first conductor, the second signal is generated on a second conductor, and the third signal is generated on a third conductor. To transmit a second data value, the second signal is generated on the first conductor, the first signal is generated on the second conductor, and the third signal is generated on the third conductor.

In some embodiments, a transmitter circuit is included that is configured to generate and transmit the three respective signals described above to a receiver over a three conductor interface. In response to a first input data value, the transmitter generates the first signal on a first conductor, the second signal on a second conductor, and the third signal on a third conductor. In response to a second input data value, the transmitter generates the second signal on the first conductor, the first signal on the second conductor, and the third signal on the third conductor.

In some embodiments, a receiver circuit is included that is configured to receive the three signals, which are unreferenced to each other, reference the signals to each other, and decode the arrangement of the received signals and conductors to decode the transmitted data value. The receiver circuit includes a reference circuit configured to reference the signals to each other and provide the referenced signals to first and second comparison circuits. The first comparison circuit is configured to compare the referenced first signal to a combination of the second and third referenced signals. The second comparison circuit is configured to compare the referenced third signal to a combination of the first and second referenced signals.

The above summary is not intended to describe each embodiment or every implementation of the present disclosure. The figures, detailed description and claims that follow more particularly exemplify various embodiments.

Aspects of the present disclosure may be more completely understood in consideration of the detailed description of various embodiments of the present disclosure that follows in connection with the accompanying drawings, in which.

Figure 1:
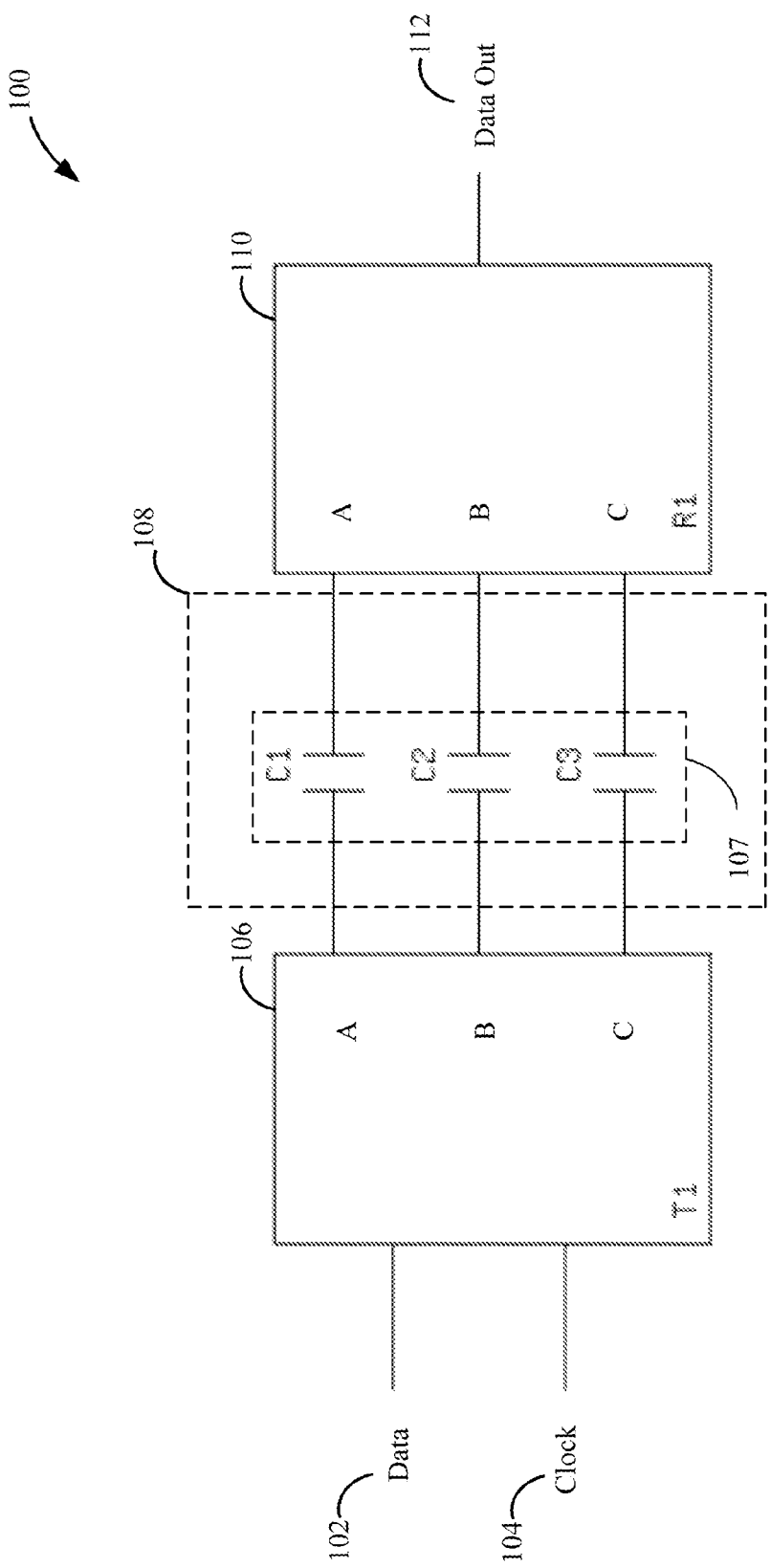
FIG. 1 depicts a block diagram of a system having a three-conductor interface for communicating between two voltage domains, consistent with one or more embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

Embodiments of the present disclosure are believed to be applicable to communication methods, devices and systems involving data communication protocols between galvanically-isolated circuits. While the present disclosure is not necessarily limited in this context, various aspects of the disclosure may be appreciated through a discussion of related examples.

Aspects of the present disclosure relate to the transmission of data between circuits that are isolated from one another. For example, circuits may be galvanically isolated using capacitive coupling on signal paths between the circuits. As a result of such isolation, the circuits operate in separate voltage domains that are not referenced to one another by a common ground voltage level. As such, large voltage differences may arise between the corresponding voltage domains.

In one or more embodiments, the circuits of different voltage domains communicate over capacitive-coupled signals paths that use non-differential signaling techniques that do not rely upon the direct comparison between two differentially transmitted signals. Particular embodiments of the present disclosure are directed toward the use of a three-conductor interface to communication between isolated voltage domains. Capacitive coupling is provided along each of the three conductors to maintain galvanic isolation between the circuits while each being connected to a corresponding conductor.

In a particular embodiment, the signaling protocol for a three-conductor interface uses an encoding scheme where a carrier signal is used to alternate signals between high and low values on a select two of the conductors while maintaining the third conductor at a low voltage. The selection of the conductors that are to carry the alternating signals depends on the data value to be communicated. The signaling protocol provides a low voltage on two of the conductors and a high voltage on the other conductor. This ratio of low and high signal values is maintained, although the signal value on any particular conductor will be varied according the carrier signal and the data to be communicated.

Alternatively, in some embodiments, an encoding scheme may alternate signals between high and low values on a select two of the conductors while maintaining the third conductor at a high voltage. As described above, the selection of the conductors that are to carry the alternating signals depends on the data value to be communicated. The signaling protocol provides a high voltage on two of the conductors and a low voltage on the other conductor. This ratio of low and high signal values is maintained, although the signal value on any particular conductor will be varied according the carrier signal and the data to be communicated. While either encoding scheme may be used, for ease of explanation, the embodiments are primarily described with reference to the first mentioned encoding scheme, where two conductors are alternated between high and low values and the other conductor is maintained at the low voltage.

Certain embodiments relate to one or more circuits having control logic that is configured and arranged to drive signals on conductors in response to input data. For instance, the control logic can respond to first input data by generating, on a first conductor, a first output signal that is maintained at a set voltage level. The control logic also generates, on a second conductor, a second output signal that alternates between voltage levels according to a carrier frequency. For a third conductor, the control logic generates a third output signal that alternates between voltage levels according to the carrier frequency and that is out of phase with the second output signal. The control logic can then respond to input data of a second, different, value by generating, on the first conductor, the second output signal that alternates between voltage levels according to the carrier frequency. The control logic also generates, on the second conductor, the first output signal that is maintained at a set voltage level and, on the third conductor, the third output signal that alternates between voltage levels according to a carrier frequency and out of phase with the second output signal.

In certain embodiments, each of the conductors is connected to a plate of a different capacitor. Each of these capacitors provides capacitive coupling to another circuit, which has a signal interface that includes three conductors connected to the corresponding plates of the capacitors. A receiver circuit can then decode data received from these three additional conductors. For instance, the receiver circuit can be configured to decode received signals by comparing a signal level corresponding to the first conductor with a signal level corresponding to a combination of the second and third conductors.

The receiving logic can also be configured and arranged to drive a set-reset logic circuit in response to comparisons of the received signals, or to drive an AC detector circuit.

In some embodiments, the switching frequency may be set to be less than the data rate. These embodiments may be particularly suited to low-power CMOS-based applications, where power efficiency is directly related to switching frequency of CMOS logic. By utilizing a lower switching frequency, lower rates of power dissipation can be achieved.

Certain aspects of the present disclosure are directed toward galvanic isolation between two integrated circuit chips housing the receiving logic and the conductors, respectively.

Turning now to the figures, FIG. 1 depicts a block diagram of a system having a three-conductor interface for communicating between a transmitter and a receiver, which operation in different voltage domains, consistent with one or more embodiments of the present disclosure. The system includes a transmitter 106 and a receiver 110, galvanically isolated from one another, and configured to communicate data values over a three-conductor interface 108 between galvanically isolated circuits. The transmitter circuit 106 includes circuitry configured and arranged to generate a first set of signals for communication over a three conductor interface 108 in response to the data signal 102 having a first value, and generate a second set of signals for communication over the three-conductor interface 108 in response to the data signal 102 having a second value. The receiver circuit 110 is configured to receive a set of unreferenced signals, via the three-conductor interface 108. The receiver circuit 110 references the signals against one another to determine if the set of unreferenced signals corresponds to the first or second sets of signals corresponding to the respective first and second values of the input data signal 102. The receiver circuit 110, outputs a data signal 112 having a value of corresponding to the determined one of the first or second sets of signals.

In this example, galvanic isolation between the transmitter 106 and receiver 110 is provided by isolation circuit 107 configured to provide capacitive coupling on each signal path of the three wire interface 108. For each signal path, a first plate of a capacitor is connected to an output of the transmitter 106 (e.g., A) and a second plate of the capacitor is connected to an input (e.g., D) of the receiver 110.

Figure 2:
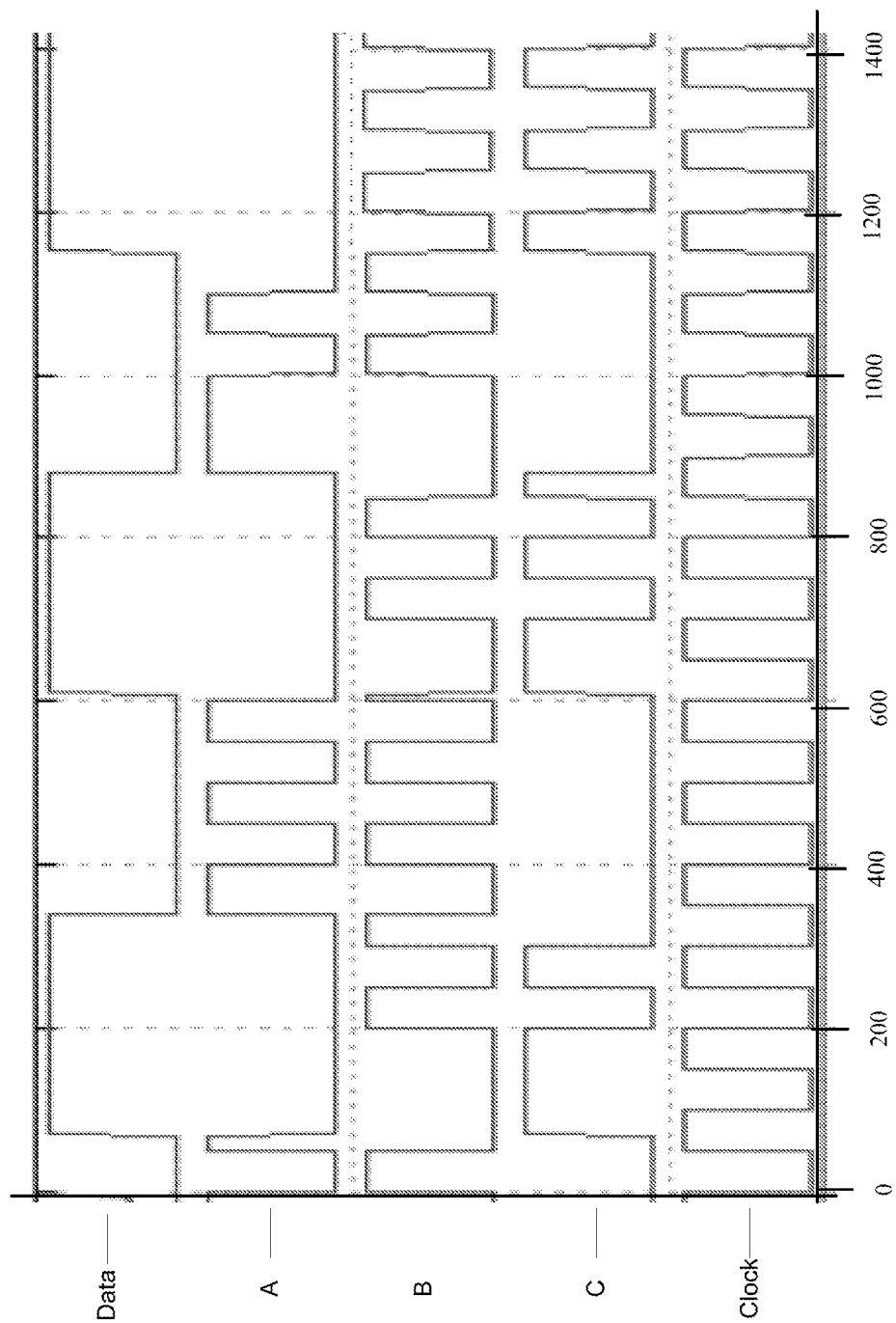
FIG. 2 depicts example waveforms generated for communication of a data value on a three-conductor interface between two voltage domains, consistent with one or more embodiments of the present disclosure.

FIG. 2 shows an example set of waveforms for encoding and communicating data over a three-conductor interface between galvanically isolated voltage domains. For ease of explanation, the waveforms shown in FIG. 2 are discussed with reference to the system shown in FIG. 1.

In response to receiving a first data value at input 102, the transmitter generates a set of three non-differential signals, which do not result in a sum transfer of current between the voltage domains. Data values are encoded, such that at any given time one of the outputs A, B, and C is high, while the others are low. In this manner, for any signal change of a particular output there is a corresponding signal change that would occur for another output. As a result, any current through any of the capacitors 107 can be compensated by a current in the opposite direction, thereby greatly reducing the electromagnetic emission.

To encode a first data value (e.g., a high voltage) of the input data signal, a first output (A) is maintained at a set voltage level on a first conductor, and second and third outputs (B and C) are alternated between high and low voltage levels according to a carrier frequency provided by clock 104 in FIG. 1. Likewise, to encode a second data value (e.g., a low voltage) of the input data signal, the third output (C) is maintained at a set voltage level and first and second outputs (B and C) are alternated between high and low voltage levels according to a carrier frequency provided by clock signal 104 in FIG. 1.

For example, in a time period from about 600 to 875 input data signal has a high data value. In response to this high data value, output A is maintained at a constant low value and outputs B and C are alternated between high and low data values according to a carrier frequency provided by the input clock signal.

As another example, in a time period from about 875 to 1150 input data signal has a low data value. In response to this low data value, output C is maintained at a constant low value and outputs A and B are alternated between high and low values according to the carrier frequency provided by the input clock signal 104.

The alternating signals are generated to be out of phase with each other. For instance, the alternating signals can be substantially 180 degrees out of phase with each other, as depicted in FIG. 2. In such a phase alignment, only one of the three output signals is asserted to the high value at a given time.

It is noted that in some implementations, the generation of the output signals may not begin immediately. For example, in the above mentioned time period in FIG. 2, signals B and C do begin to alternate for 1 completed clock cycle after the value of the input data signal changes. Some embodiments may be particularly suited for manufacturing processes that suffer from process variations because pulse width distortion of the waveforms does not depend on production variations. This is because delays for rising and falling edges in the data input signal are essentially the same. For instance, a rising edge in Data corresponds to a rising edge in A, and the falling edge in A corresponds to a rising edge in B. If circuits processing the A and B signals are essentially the same, the resulting delays are the same, and pulse width distortion will be reduced. This pulse width distortion can be reduced at a low clock frequencies or when the rising and falling edges of signals A and B have a different delay.

Referring again to FIG. 1, the receiver 110 is able to decode the transmitted data value by comparing one of the three signals against a combination of the other two. By comparing the three signals, it can be determined which of the three conductors is maintained at the constant value. In this manner, the original data value can be determined by the receiver.

In one embodiment, the receiver is configured to receive the three signals, which are unreferenced to each other, and reference the signals to each other using a reference circuit. The reference signals are compared by first and second comparison circuits to determine the data value. The first comparison circuit is configured to compare the referenced first signal to a combination of the second and third referenced signals. The second comparison circuit is configured to compare the referenced third signal to a combination of the first and second referenced signals.

Figure 3:
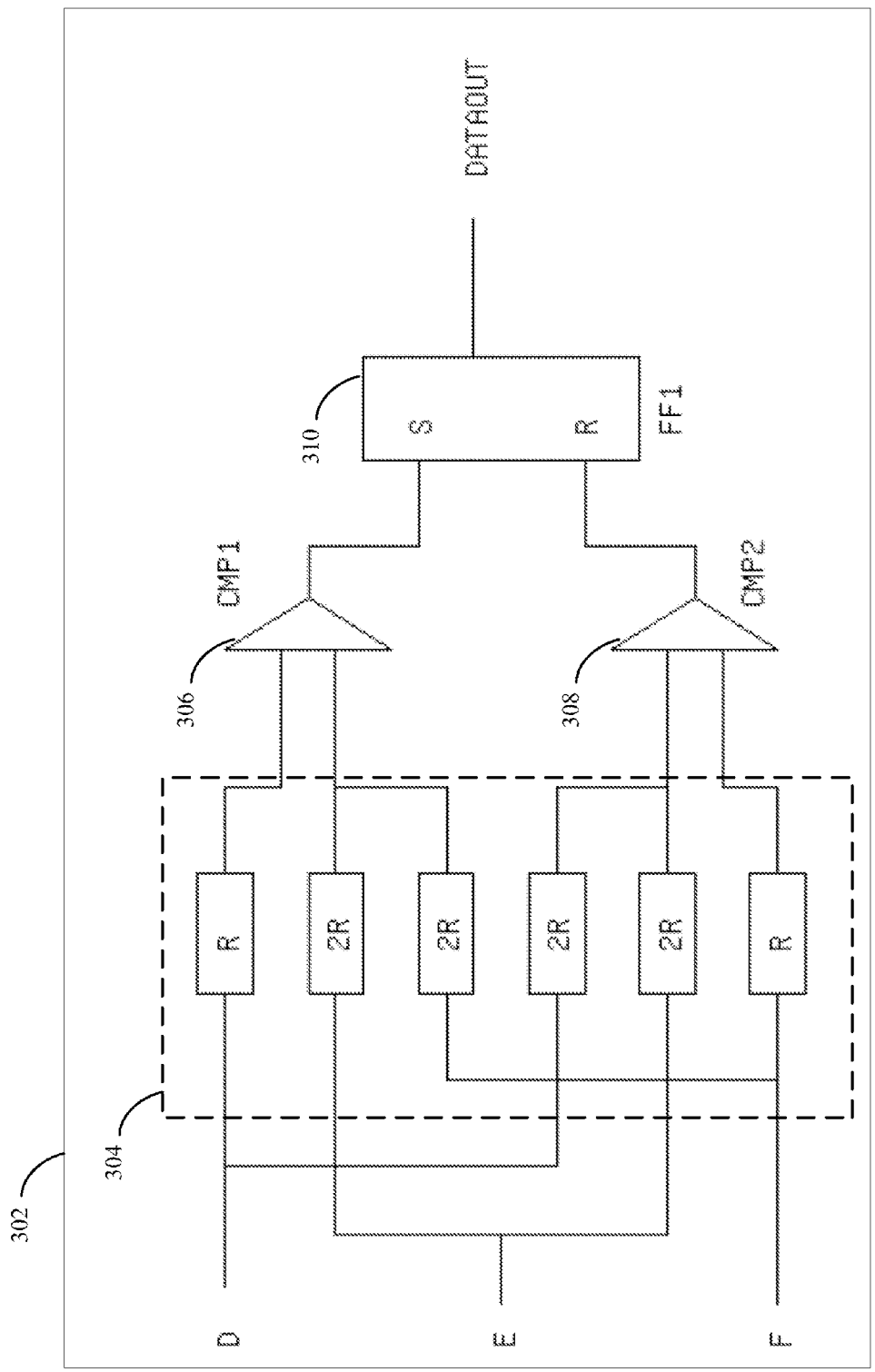
FIG. 3 shows a block diagram of a circuit that may be used to implement a receiver, in accordance with one or more embodiments.

FIG. 3 shows a block diagram of a circuit that may be used to implement a receiver, in accordance with one or more embodiments. Due to the galvanic isolation between a transmitter and the receiver, signals received on the three conductors have floating voltages and do not necessarily share have a common reference voltage. As a result, the DC reference point for may differ significantly for each of the signals. To provide a point for comparison, the circuit 302 includes a reference circuit 304 configured to reference the three signals to each other. The reference circuit 302 generates a referenced version of signal A, a referenced version of signal C, a combination of signals A and B, and a combination of signals B and C. For instance, in one embodiment, a first voltage bridge is connected between inputs of the receiver at which signals B and C are received. The first voltage bridge generates the voltage level of an average of signals A and B at a reference node of the first voltage bridge. Similarly, a second voltage bridge is connected between the inputs of the receiver at which signals A and B are received. The second voltage bridge is configured and arranged to generate the voltage level of an average of the signals B and C at a reference node of the second voltage bridge.

The receiver includes two comparison circuits, each configured to detect the combination of signals corresponding to one of the encoded data values. A first one of the comparison circuits 306 is configured to compare the referenced signal A to a combination of the B and C signals. A second one of the comparison circuits 308 is configured to compare the referenced signal C to a combination of the A and B signals.

When referenced to each other, a combination of the alternating signals should be greater than the signal having a constant low value. Therefore, if the combination of the B and C signals is greater than the referenced A signal, it can be inferred that the A signal is being maintained as the low signal and the decoded data value is high. Likewise, if the combination of the A and B signals is greater than the referenced C signal, is can be inferred that the C signal is being maintained at the constant low value and the decoded data value is low.

In the implementation shown in FIG. 3, the receiver circuit includes a set-reset logic circuit 310 configured to generate a binary output signal having a data value based on the outputs of the first and second comparison circuits 306 and 308. The set-reset logic circuit has a first input (Se) coupled to an output of the first comparison circuit 306 and a second input (R) coupled to an output of the second comparison circuit 308.

When the first comparator circuit 306 detects the referenced A signal is less than the combination of B and C signal, the first comparator outputs a high value to the S input, which causes the set-reset circuit 310 to generate an output signal having a high data value. When the second comparator circuit 308 detects that the referenced C signal is less than the combination of A and B signals, it outputs a high data value to the R input, which causes the set-reset circuit 310 to generate an output signal having a low data value.

In some embodiments, the receiver circuit may be configured to compare currents of the referenced signals to decode the transmitted data value. For instance, currents of signals B and C may be added together and compared to the current of signal A to infer whether signal A is being maintained as the low signal to encode the first data value. Likewise, currents of signals A and B may be added together and compared to the current of signal C to infer whether signal C is being maintained as the low signal to encode the second data value. In some implementations, the voltages of the referenced signals may be converted to currents by a voltage to current converter. In other implementations, signal currents may be detected directly from the capacitively coupled signal lines.

The various embodiments as discussed herein may be implemented using a variety of structures and related operations/functions. For instance, one or more embodiments as described herein may be computer-implemented or computer-assisted, as by being coded as software within a coding system as memory-based codes or instructions executed by a logic circuit, computer processor, microprocessor, PC or mainframe computer. Such computer-based implementations are implemented using one or more programmable or programmed circuits that include at least one computer-processor and internal/external memory and/or registers for data retention and access. One or more embodiments may also be implemented in various other forms of hardware such as a state machine, programmed into a circuit such as a field-programmable gate array, or implemented using electronic circuits such as digital or analog circuits. In addition, various embodiments may be implemented using a tangible storage medium that stores instructions that, when executed by a processor, performs one or more of the steps, methods or processes described herein. These applications and embodiments may also be used in combination; for instance certain functions can be implemented using discrete logic (e.g., a digital circuit) that generates an output that is provided as an input to a processor. For instance, data signals may be encoded and decoded for communication over a three-conductor interface using a combination of logic circuitry and a processing circuit configured using firmware or other software.

In certain instances, one or more embodiments can use different coding techniques and different types of circuits communicating data through the isolation region. The data communications can use analog, digital, RF, serial and/or parallel communication techniques. For certain high-speed applications, different types of modulation schemes can be used for carrying information across the isolation region, including but not limited to OOK (on-off keying), amplitude, phase-based and/or frequency-based. In some instances, communications can be carried out between multiple circuits placed within a single chip-package (e.g., BGA package) and also having galvanic isolation therebetween. The various communications can be carried out using different isolation buffer circuits and amplifiers. Various applications are also contemplated including, but not limited to, applications in which small voltage differences exist between transmitters and receivers and applications in which large voltages can exist (e.g., hundreds of volts as can be used in automotive applications where electric motors are used in place of (or in combination with) combustion engines). Consistent with one or more embodiments discussed herein, U.S. Pat. No. 6,920, 576 (filed May, 31, 2001; Ehmann, Gregory E.), U.S. Pat. No. 6,882,046 (filed Dec. 18, 2001; Davenport, et al.) and "Signal Isolation Buffer Amplifiers" Burr-Brown, ISO102, ISO106, January 1995, each describe useful technical details, applications and various background information, and each of these documents is fully incorporated herein by reference.

While the present disclosure is amenable to various modifications and alternative forms, specifics thereof have been shown by way of example in the drawings and will be described in further detail. It should be understood that the intention is not to limit the disclosure to the particular embodiments and/or applications described. On the contrary, the intention is to cover all modifications, equivalents, and alternatives falling within the spirit and scope of the present disclosure.

What is claimed is:

1. A device comprising:
    a transmitter circuit, including:
        circuitry configured and arranged to respond to input data of a first value by:
            generating, on a first conductor, a first output signal that is maintained at a set voltage level;
            generating, on a second conductor, a second output signal that alternates between voltage levels according to a carrier frequency; and
            generating, on a third conductor, a third output signal that alternates between voltage levels according to the carrier frequency and that is out of phase with the second output signal; and
        circuitry configured and arranged to respond to input data of a second, different, value by:
            generating, on the first conductor, the second output signal that alternates between voltage levels according to the carrier frequency;
            generating, on the second conductor, the first output signal that is maintained at a set voltage level; and
            generating, on the third conductor, the third output signal that alternates between voltage levels according to a carrier frequency and out of phase with the second output signal.

2. The device of claim 1, wherein the circuit further includes the first, second and third conductors and wherein each of the first, second and third conductors are connected to a corresponding and different capacitor.

3. The device of claim 1, further including a receiving circuit configured to receive signals from the conductors using capacitive coupling.

4. The device of claim 1, further including a receiving circuit configured to receive signals from the conductors using a capacitive coupling circuit configured to provide galvanic isolation between the receiving circuit and the conductors.

5. The device of claim 1, wherein the transmitter circuit is further configured to communicate the input data without the use of differential signaling.

6. The device of claim 1, further including a receiving circuit configured to receive signals from the conductors using a capacitive coupling circuit configured to provide galvanic isolation between two integrated circuit chips housing the receiving circuit and the conductors, respectively.

7. The device of claim 1, further including a receiving circuit configured and arranged to receive signals from the conductors using a capacitive coupling circuit and to decode the input data by comparing a signal level corresponding to the first conductor with a signal level corresponding to a combination of the second and third conductors.

8. The device of claim 7, wherein the receiving circuit is further configured and arranged to decode the input data by comparing a signal level of the second of the conductors with a signal level corresponding to a combination of the first and third conductors.

9. The device of claim 8, wherein the receiving circuit is further configured and arranged to drive a set-reset logic circuit in response to the comparisons.

10. The device of claim 9, wherein the receiving circuit is further configured and arranged to drive an AC detector logic circuit in response to the comparisons.

11. The device of claim 1, wherein the transmitter circuit includes:
    a first driver circuit, configured and arranged to:
        in response to input data of the first value, maintained the first conductor at the set voltage level; and
        in response to input data of a second value, alternate the first conductor between voltage levels according to a carrier frequency;
    a second driver circuit, configured and arranged to:
        in response to the input data of the first value, alternate the second conductor between voltage levels according to the carrier frequency; and
        in response to the input data of the second value, maintained the second conductor at the set voltage level; and
    a third driver circuit, configured and arranged to alternate the third conductor between voltage levels according to the carrier frequency and out of phase with the second output signal.

12. A method for communicating between first and second voltage domains, comprising:
    communicating a first data value by:
        communicating, on a first conductor, a first signal that is maintained at the set voltage level;
        communicating, on a second conductor, a second signal that alternates between the voltage levels according to the carrier frequency; and
        communicating, on a third conductor, a third signal that alternates between voltage levels according to the carrier frequency and that is out of phase with the second signal; and
    communicating a second data value by:
        communicating, on the first conductor, the second signal that alternates between voltage levels according to the carrier frequency;
        communicating, on the second conductor, the first signal that is maintained at the set voltage level; and communicating, on the third conductor, the third signal that alternates between voltage levels according to the carrier frequency and is out of phase with the second signal.

13. The method of claim 12, wherein communicating the first data value includes:

encoding the first data value to produce the first, second, and third signals; and transmitting the first, second, and third signals on the respective first, second, and third conductors.

14. The method of claim 12, wherein communicating the first data value includes:

receiving the first second and third signals on the first, second, and third conductors, decoding the first, second, and third signals to produce the first data value.

* * * * *